United States Patent
Feng et al.

(10) Patent No.: US 12,363,930 B2
(45) Date of Patent: Jul. 15, 2025

(54) ELECTRON EXTRACTION TYPE FREE-WHEELING DIODE DEVICE AND PREPARATION METHOD THEREOF

(71) Applicant: JSAB Technologies (Shenzhen) Ltd., Shenzhen (CN)

(72) Inventors: Hao Feng, Shenzhen (CN); Yong Liu, Shenzhen (CN); Johnny Kin On Sin, Shenzhen (CN)

(73) Assignee: JSAB TECHNOLOGIES (SHENZHEN) LTD., Shenzhen (CN)

( * ) Notice: Subject to any disclaimer, the term of this patent is extended or adjusted under 35 U.S.C. 154(b) by 432 days.

(21) Appl. No.: 18/069,661

(22) Filed: Dec. 21, 2022

(65) Prior Publication Data
US 2023/0290890 A1    Sep. 14, 2023

(30) Foreign Application Priority Data
Mar. 10, 2022   (CN) .......................... 202210229795.8

(51) Int. Cl.
*H10D 8/60* (2025.01)
*H01L 21/265* (2006.01)
(Continued)

(52) U.S. Cl.
CPC ....... *H10D 8/605* (2025.01); *H01L 21/26513* (2013.01); *H01L 21/266* (2013.01); *H01L 21/30655* (2013.01); *H10D 8/051* (2025.01); *H10D 62/109* (2025.01); *H10D 62/117* (2025.01)

(58) Field of Classification Search
CPC ...... H10D 8/605; H10D 8/051; H10D 62/109; H10D 62/117; H10D 8/00; H10D 8/045; H10D 62/8325; H10D 62/10; H10D 62/128; H01L 21/26513; H01L 21/266; H01L 21/30655
See application file for complete search history.

(56) References Cited

U.S. PATENT DOCUMENTS

2016/0104702 A1\* 4/2016 Hsieh .................. H10D 64/661
                                                                257/334
2017/0025522 A1\* 1/2017 Naito .................. H10D 64/513
(Continued)

FOREIGN PATENT DOCUMENTS

CN          103180961 A     6/2013
CN          106876485 A     6/2017
(Continued)

*Primary Examiner* — Yasser A Abdelaziz
(74) *Attorney, Agent, or Firm* — MUNCY, GEISSLER, OLDS & LOWE, P.C.

(57) ABSTRACT

An electron extraction type free-wheeling diode device and a preparation method thereof are provided by the present disclosure, and more than one first structures for increasing the density of electron extraction pathways are provided on a N-type drift region. Each of the first structures includes a lightly doped P-type base region, a heavily doped N-type emitter region located on the lightly doped P-type base region, a P-type trench anode region, and a trench region located on the P-type trench anode region. The barrier height of the punch-through NPN triode can be tuned in a wide range, which has beneficial effects on soft and fast adjustment of the reverse recovery process.

12 Claims, 12 Drawing Sheets

(51) Int. Cl.
*H01L 21/266* (2006.01)
*H01L 21/3065* (2006.01)
*H10D 8/01* (2025.01)
*H10D 62/10* (2025.01)

(56) References Cited

U.S. PATENT DOCUMENTS

2019/0081170 A1 3/2019 Kumagai
2019/0109218 A1* 4/2019 Corvasce ............ H01L 21/2253
2021/0273083 A1 9/2021 Yamashiro et al.

FOREIGN PATENT DOCUMENTS

| CN | 109065638 A | 12/2018 |
| CN | 109192787 A | 1/2019 |

* cited by examiner

ELECTRON EXTRACTION TYPE FREE-WHEELING DIODE DEVICE AND PREPARATION METHOD THEREOF

FIELD OF TECHNOLOGY

The present disclosure relates to a power semiconductor device, and in particular to a structure of an electron extraction type free-wheeling diode device as well as a preparation method thereof.

BACKGROUND

To reduce carbon emission and achieve "carbon neutrality", the fields of photovoltaic power generation, electric vehicles and intelligent rail transit have been developing rapidly in recent years, and power semiconductor devices represented by Insulated gate bipolar transistor (IGBT) have been used in a large scale. The IGBT, by virtue of its easy gate drive, high power density and fast switching speed, can effectively improve energy utilization rate for motor drives and power conversion. Hard switching mode, with the advantages of simple driving circuit topology and easy controlled cost, has become a common switching mode for IGBT in inductive load applications. In inductive load applications, the Free-wheeling diode (FWD) is used in antiparallel with IGBT to achieve continuous current in inductive load circuits and protect IGBT from electrical stress shock. To satisfy application requirements of low power loss, low noise and high switching speed, a large softness factor and a short reverse recovery time of the anti-paralleled FWD are needed, i.e., soft and fast reverse recovery process. Increasingly improving the "soft & fast" characteristics of reverse recovery of FWD has become a key for high-end FWD device design, and is also one of the bottlenecks for further improving energy utilization rate.

Based on global lifetime control technology, a recombination center is introduced into FWD semiconductor materials by diffusing heavy metals such as gold and platinum to reduce the lifetime of carriers and promote the recombination of the carriers, thus reducing the reverse recovery time. However, such technology brings about problems such as large leakage current at high temperature, increased on-state voltage drop VF and heavy metal contamination. Although the heavy metal contamination problem can be solved by shortening the lifetime with electron irradiation, the introduced recombination center is unstable at high temperature, and the lifetime control effect is diminished. With the development of the lifetime control technology, the local lifetime control can be achieved by using ion implantation such as $H^+$ and $He^{2+}$. The soft characteristic of reverse recovery is achieved by selecting particle implantation position in the device, and the amount of lifetime reduction is achieved by adjusting implantation dose so as to change the reverse recovery time. However, its process is complex, and the high-dose particle implantation may bring about high leakage current of the device at high temperature.

For anode injection efficiency control technology which serves as another type of solution, a variety of novel structures have been adopted by the industry. The Merged PiN Schottky (MPS) structure combines a PN junction and a Schottky junction (metal/N-type semiconductor) in the anode region of the diode for controlling the hole injection efficiency in the P region of the anode. It can reduce the number of electron and hole pairs within the drift region and reduce the time required for carrier extraction and recombination during reverse recovery, which achieves fast reverse recovery process. By controlling the electrons, the Schottky junction can adjust a ratio of unipolar (electrons) to bipolar (electrons and holes) conductivity within the drift region, thus controlling the reverse recovery time. Meanwhile, the on-state voltage drop (0.3 V) of the Schottky junction is lower than that of the PN junction (0.7 V), ensuring that the VF of the MPS structure is lower than that of the PiN diode. Because of barrier lowering effect of the Schottky junction at high electric fields and high temperatures, the MPS structure suffers from the increased leakage current at high temperatures and high electric fields, which restricts its application at high temperatures and high voltages. Structures such as Trench Oxide PiN Schottky (TOPS) and Trench MOS Barrier Schottky (TMBS) have been proposed to shield the effect of electric fields on Schottky barrier under high voltage, which introduces the trench type Junction Field Effect Transistor (JEFT) structure and the MOS structure, respectively. Then the breakdown voltage (BV) of the MPS is raised to 1000 V. Although the TOPS and TMPS can shield the Schottky junction, the shielding effect may be diminished at the conditions of high temperature and high electric field, and the increase of the leakage current at high temperatures and high electric fields still exists.

Self-adjusting P Emitter Efficiency Diode (SPEED) introduces a Schottky junction of a metal/P-type semiconductor into the P-type anode region to control the anode hole efficiency. As shown in FIG. 1, the anode region is formed by part of P+ and P regions, the P-type region has a relatively low doping concentration and forms a Schottky junction with the anode metal. The Schottky junction, as the barrier of the holes in the anode, can effectively reduce the injection efficiency of the P+ without affecting the transportation of electrons from cathode to anode. As the formed Schottky junction is completely located in the anode PN junction, its leakage current at high temperatures and high electric fields is comparable to that of the conventional PiN diode. According to such structure, the distribution of the carriers is low at the anode side and high at the cathode side, and soft and fast reverse recovery characteristics are achieved. However, the adjustment of the Schottky barrier height is limited by the BV and on-state resistance, which limits the adjustment of the hole injection efficiency.

According to the problems in the above silicon-based free-wheeling diode technology, an innovative device structure needs to be provided to ensure low VF and reduce leakage current at high temperatures and high electric fields on the basis of achieving soft and fast reverse recovery characteristics, which can satisfy requirements of device reliability in harsh application environments.

SUMMARY

To solve the problems above, the present disclosure provides the following technical solution:

An electron extraction type free-wheeling diode device includes a cathode electrode located at the bottom, a heavily doped N-type semiconductor substrate and a N-type buffer layer located above the substrate, a N-type drift region located above the N-type buffer layer, and a P-type planar anode region located above the N-type drift region. More than one first structures for increasing the density of electron extraction pathways are provided on the N-type drift region, each of the first structures includes a lightly doped P-type base region, a heavily doped N-type emitter region located on the lightly doped P-type base region, a P-type trench anode region, and a trench region located on the P-type trench anode region. The heavily doped N-type emitter region, the lightly doped P-type base region and the N-type drift region form a punch-through NPN structure. The N-type drift region, the P-type planar anode region and the P-type trench anode region form a JFET structure. The P-type planar anode region and the P-type trench anode region form a Schottky contact with an anode electrode, and the heavily doped P-type ohmic contact region forms an ohmic contact with the anode electrode. An upper surface of the P-type planar anode region is provided with a partially heavily doped P-type ohmic contact region, anode metal is arranged in the trench region, an upper surface of the device is provided with an anode electrode, and the anode electrode is isolated from the N-type drift region.

Further, the anode electrode is isolated from the N-type drift region by means of an insulating dielectric layer arranged on a sidewall of the trench.

Further, a cross-sectional shape of the trench region is inverted trapezoid, and an angle α between the sidewall and a vertical direction is 60° to 90°.

Further, cross-sectional shapes of the heavily doped N-type emitter region and the lightly doped P-type base region are slope shapes in fit with an outer sidewall of the trench region.

Further, the P-type trench anode region is in contact with the sidewall and the bottom of the trench region, and the anode electrode forms a Schottky contact with the P-type trench anode region.

Further, the heavily doped P-type ohmic contact region has a lateral width smaller than that of the P-type planar anode region, and an area ratio of the heavily doped P-type ohmic contact region to the whole anode is 10% to 90%.

Further, the P-type trench anode region has a U-shaped topography.

The present disclosure further provides a preparation method for the electron extraction type free-wheeling diode device above. The preparation method includes the following steps:

firstly, forming a N-type buffer layer and a N-type drift region on a heavily doped N-type semiconductor substrate, and then forming a trench region on the N-type drift region; secondly, forming a mask layer on the upper surface of the N-type drift region to protect a sidewall of the trench, and forming an ion implantation window by means of dry etching, and forming a P-type planar anode region and a P-type trench anode region by means of ion implantation and high temperature drive-in;

thirdly, forming an ion implantation window of a punch-through NPN triode region: performing P-type ion implantation and high temperature drive-in to form a lightly doped P-type base region, and then performing N-type ion implantation to form a heavily doped N-type emitter region;

fourthly, forming an ion implantation window of a heavily doped P-type ohmic contact region on the upper surface of the P-type planar anode region, and then performing P-type ion implantation;

fifthly, forming an insulating dielectric layer on the surfaces of the P-type planar anode region, the heavily doped P-type ohmic contact region, a heavily doped N-type emitter region and a vertical trench, wherein the width of the insulating dielectric layer is smaller than that of the vertical trench region; and then performing annealing and drive-in on the semiconductor device at a high-temperature with nitrogen atmosphere to repair lattice damage and activate implanted impurities of heavily doped P-type ohmic contact region and the heavily doped N-type emitter region;

finally, depositing anode metal and cathode metal on the front and back of the semiconductor device, respectively, planarizing the front metal, and then performing sintering at a high-temperature with nitrogen atmosphere to achieve an alloy junction, thus forming an anode electrode and a cathode electrode, respectively.

Further, in the process of forming the insulating dielectric layer, a sidewall region of the vertical trench is selectively retained to form the insulating dielectric layer.

Further, in the last step, the heavily doped N-type semiconductor substrate is thinned to reduce on-state resistance.

Further, adjustment of an inverted trapezoidal slope angle is achieved by controlling etching energy, etching time, and passivation time during etching of the trench region.

Further, the P-type trench anode region of a U-shaped topography is formed by controlling an ion implantation angle and drive-in time.

Compared with the prior art, the present disclosure has the beneficial effects that:

(1) The adjustment of the anode hole injection efficiency is achieved by adjusting a punch-through voltage of the NPN triode. Compared to changing the barrier height of the Schottky junction and an individual PN junction, the barrier height of the punch-through NPN triode is wide in adjustable range, and the magnitude of soft and fast adjustment of reverse recovery process can be increased.

(2) P-type planar anode region and P-type trench anode region are both subject to hole injection at low currents, and the conductive area for holes is similar to that of the conventional PiN, without significantly increasing the on-state voltage drop VF. The heavily doped P-type ohmic contact region is subjected to hole injection at high currents, without degrading the forward surge current capability of the device.

(3) The barrier height of electron extraction consists of a PN junction depletion region, while there is a JFET structure to shield the high electric field, which can effectively reduce the leakage current under the high electric field.

(4) The anode hole injection efficiency is adjusted by controlling the electron extraction, the reverse recovery characteristics close to that of the local lifetime control technology can be achieved. Meanwhile, the process difficulty and preparation cost are reduced. Because no lifetime control is needed, the leakage current under the high temperature is reduced.

(5) The adjustment of the area and position of the punch-through NPN structure is achieved by changing the density and topography of the trench, then the hole injection efficiency of anode is changed, and the design flexibility and design dimensions of the device are increased.

DESCRIPTION OF THE EMBODIMENTS

The present disclosure provides an electron extraction type free-wheeling diode device and a preparation method thereof, and provides the following specific embodiments. It needs to be noted that corresponding positional words described herein, such as "upper," "lower," "left," "right," "front," and "rear," are relative positions corresponding to those illustrated with reference to drawings. The fixed orientation is not limited during specific implementations. In practical implementation, the present device structure is not limited to silicon-based diodes, but is equally applicable for silicon carbide-based diodes.

It needs to be noted that in the description of the following embodiments, it is considered that a semiconductor substrate of the free-wheeling diode is made of a Si material. However, the substrate may also be made of any other materials suitable for the preparation of the device, such as silicon carbide (SiC) and germanium (Ge).

Embodiment 1

Figure 1:
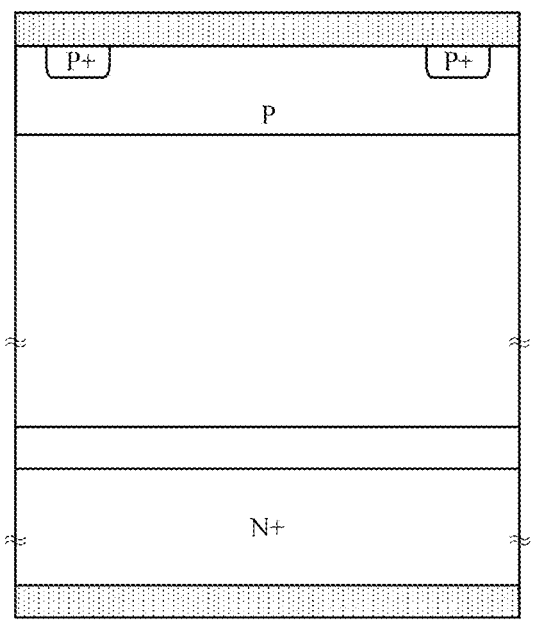
FIG. 1 is a schematic diagram of a cross section of a self-adjusting P emitter efficiency diode (SPEED) structure in the prior art.
Figure 2:
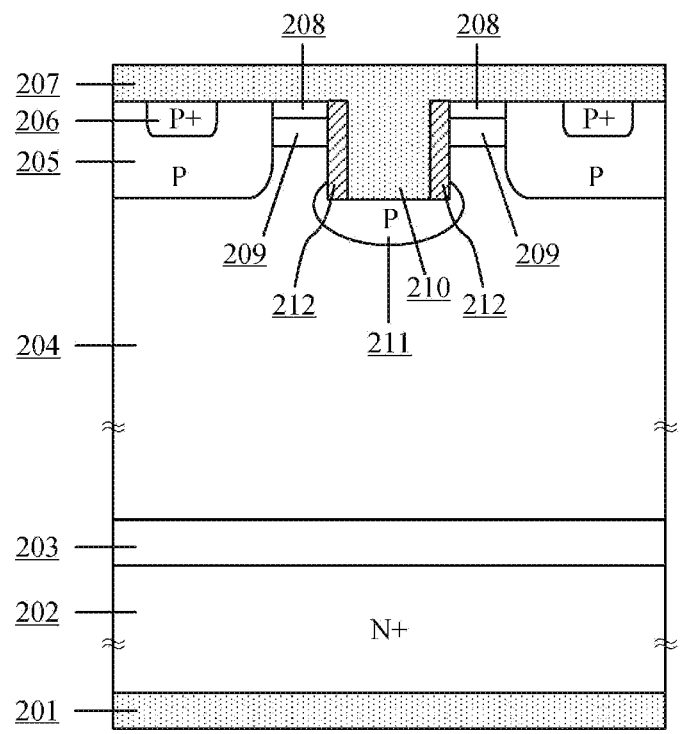
FIG. 2 is a schematic diagram of a cross section of an electron extraction type free-wheeling diode device structure with a vertical trench in accordance with a first embodiment of the present disclosure.

FIG. 2 is a schematic diagram of a cross section of a vertical trench electron extraction type free-wheeling diode device structure in accordance with a first embodiment of the present disclosure. The device structure consists of: a cathode electrode (201) located at the bottom, a heavily doped N-type semiconductor substrate (202) and a N-type buffer layer (203) which are in turn located above the cathode electrode (201). And a N-type drift region (204) is located on the N-type buffer layer (203). An upper surface of the N-type drift region (204) is a P-type planar anode region (205), a lightly doped P-type base region (209), and a P-type trench anode region (211). An upper surface of the P-type planar anode region (205) is provided with a partially heavily doped P-type ohmic contact region (206). An upper surface of the lightly doped P-type base region (209) is provided with a heavily doped N-type emitter region (208). The P-type planar anode region (205) is adjacent to the heavily doped N-type emitter region (208) and the lightly doped P-type base region (209), and the P-type planar anode region (205) and the heavily doped P-type ohmic contact region (206) are connected to the heavily doped N-type emitter region (208) by means of an upper surface anode electrode (207). The anode electrode (207) is connected to the upper surface of a P-type trench anode region (211) by means of a vertical trench region (210), and a sidewall of the vertical trench region (210) is an insulating dielectric layer (212). The insulating dielectric layer (212) is configured to isolate the heavily doped N-type emitter region (208) and the lightly doped P-type base region (209) from anode metal in the vertical trench region (210). The P-type trench anode region (211) is separated from both the lightly doped P-type base region (209) and the P-type planar anode region (205) by means of the N-type drift region (204). The heavily doped N-type emitter region (208), the lightly doped P-type base region (209) and the N-type drift region (204) form a punch-through NPN triode structure; and the N-type drift region (204), the P-type planar anode region (205) and the P-type trench anode region (211) form a JFET structure.

The heavily doped N-type emitter region (208) has a doping concentration which is greater than 1e18 cm$^{-3}$, and forms an ohmic contact with the anode electrode (207). A punch-through voltage of the punch-through NPN triode structure formed by the heavily doped N-type emitter region (208), the lightly doped P-type base region (209) and the N-type drift region (204) is 0.3 V to 1V. The punch-through voltage of the NPN triode can be changed by adjusting a junction depth and a doping concentration of the lightly doped P-type base region (209).

The width of the insulating dielectric layer (212) on the sidewall of the vertical trench region (210) is smaller than that of the vertical trench region (210) and is about 0.1 μm to 2 μm. The insulating dielectric layer (212) is made of insulating materials such as SiO and SiC. The depth of the trench region (210) is similar to that of the P-type planar anode region (205) and is between 2 μm to 5 μm.

The P-type planar anode region (205) and the P-type trench anode region (211) have the same doping concentration and form a Schottky contact with the anode electrode (207). The heavily doped P-type ohmic contact region (206) has a doping concentration greater than 1e18 cm$^{-3}$, and forms the ohmic contact with the anode electrode (207). The heavily doped P-type ohmic contact region (206) has a lateral width smaller than that of the P-type planar anode region (205), and an area ratio of the heavily doped P-type ohmic contact region to the whole anode is adjustable in the range of 10% to 90%. The heavily doped P-type ohmic contact region (206) has a depth smaller than 1 μm, and is located outside a PN junction depletion region formed by the P-type planar anode region (205) and the N-type drift region (204).

A N-type channel of the JEFT structure formed by the N-type drift region (204), the P-type planar anode region (205) and the P-type trench anode region (211) has a width of 0.1 μm to 2 μm, such that the JFET channel is completely pinched off when the diode is reversely blocked, and the JFET channel is formed when the diode is forwardly conducted.

Figure 3:
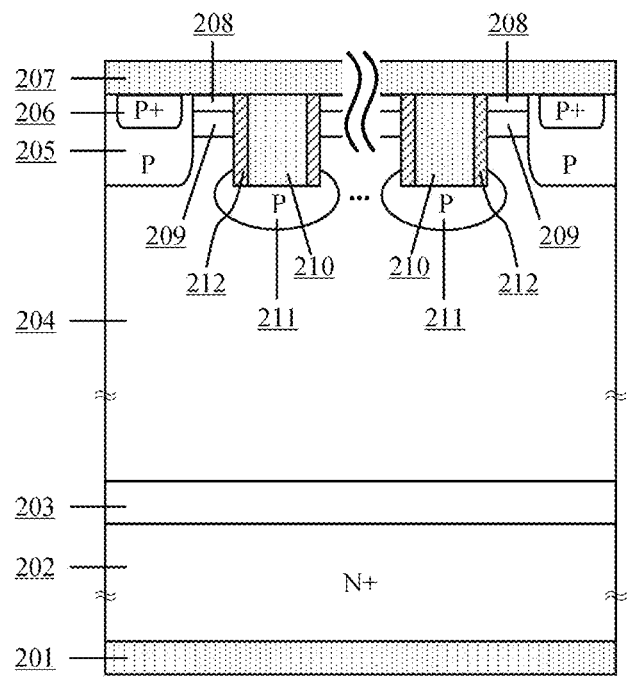
FIG. 3 is a schematic diagram of a cross section of an electron extraction type free-wheeling diode device structure with an enhanced vertical trench in accordance with a first embodiment of the present disclosure.

Further, in the same cell, as shown in FIG. 3, the heavily doped N-type emitter region (208) and the lightly doped P-type base region (209) may be arranged alternately with the vertical trench region (210), the P-type trench anode region (211) and the insulating dielectric layer (212), thus increasing the density of the electron extraction pathway of the punch-through NPN structure. The JFET structure is formed between the P-type planar anode region (205) and the P-type trench anode region (211).

Figure 8:
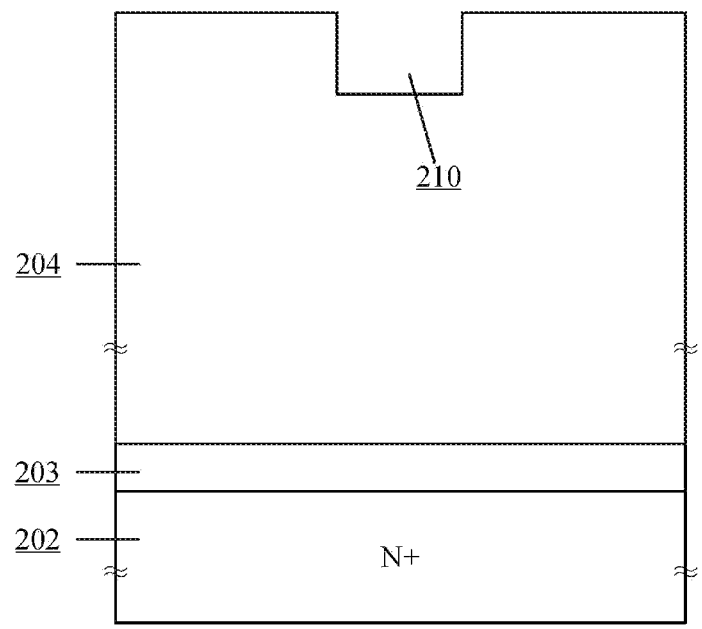
FIG. 8 to FIG. 13 are cross-sectional schematic diagrams of main preparation steps in accordance with a first embodiment of the present disclosure.

In addition, the present disclosure further provides a preparation method of the device of the first embodiment, as shown in FIGS. 8-13:

Firstly, a N-type buffer layer (203) and a N-type drift region (204) are formed on a heavily doped N-type semiconductor substrate (202) by using an epitaxy process, and then a vertical trench (210) is formed on the upper surface of the N-type drift region (204) by means of dry etching, where the trench has a depth of 2 μm to 5 μm, as shown in FIG. 8.

Figure 9:
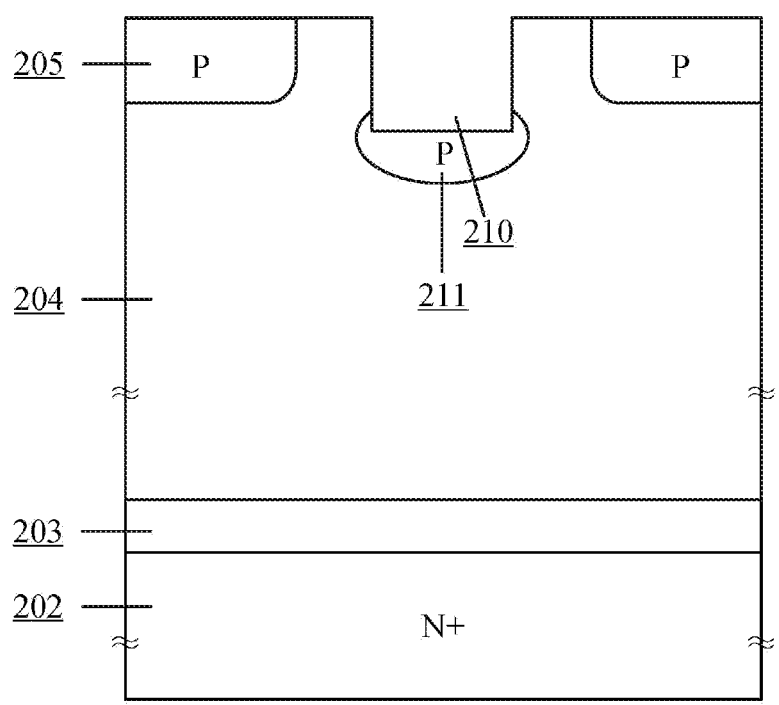

Secondly, as shown in FIG. 9, a mask layer is formed on the upper surface of the N-type drift region (204) to protect a sidewall of the vertical trench (210). An ion implantation window is formed by means of dry etching, and a P-type planar anode region (205) and a P-type trench anode region (211) are formed by means of ion implantation and high temperature drive-in. A commonly used impurity for P-type implantation is boron.

Figure 10:
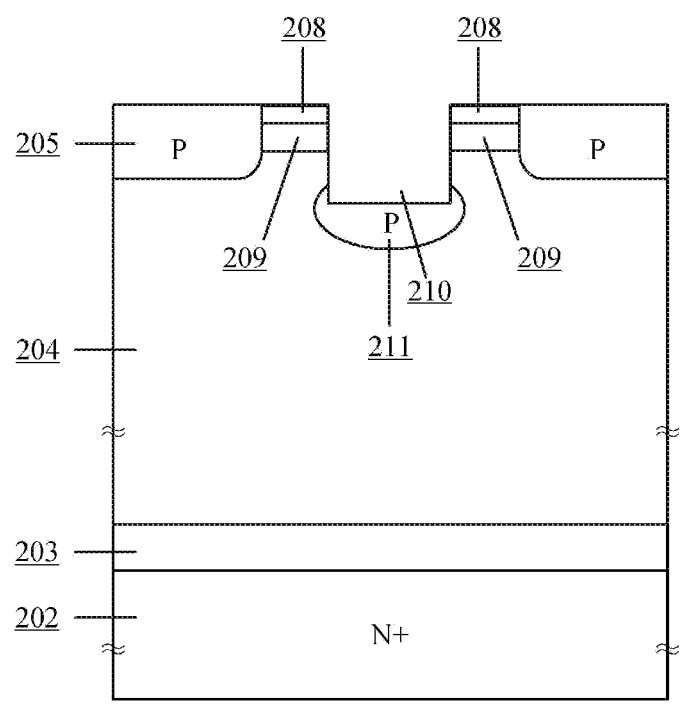

Thirdly, as shown in FIG. 10, at the position between the P-type planar anode region (205) and the vertical trench (210), an ion implantation window of a punch-through NPN triode region is formed by dry-etching the mask layer: at first, P-type ion implantation and high temperature drive-in are performed to form a lightly doped P-type base region (209). And a commonly used impurity for P-type implantation is boron; and then N-type ion implantation is performed to form a heavily doped N-type emitter region (208). And a commonly used impurity for N-type implantation is arsenic.

Figure 11:
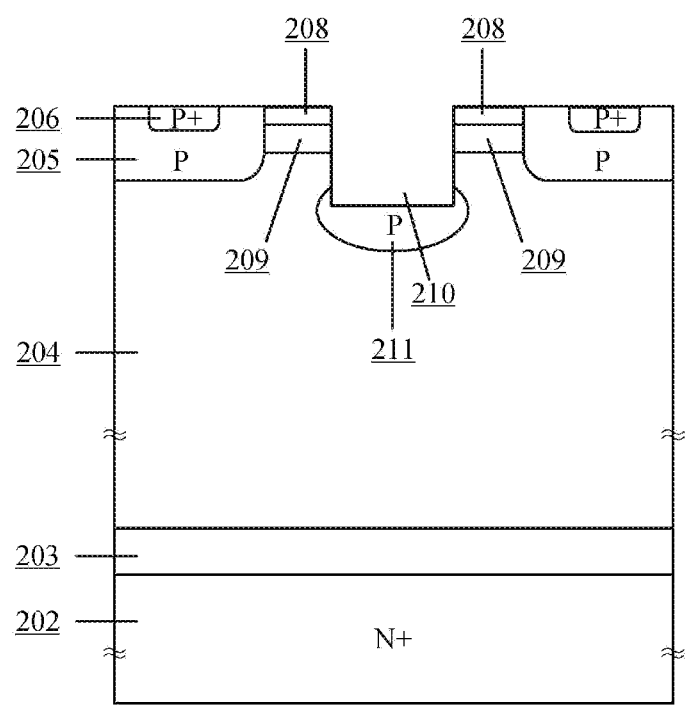

Fourthly, as shown in FIG. 11, an ion implantation window of a heavily doped P-type ohmic contact region (206) is formed on the upper surface of the P-type planar anode region (205) by dry-etching the mask layer, and then P-type ion implantation is performed. A commonly used impurity for P-type implantation is boron.

Figure 12:
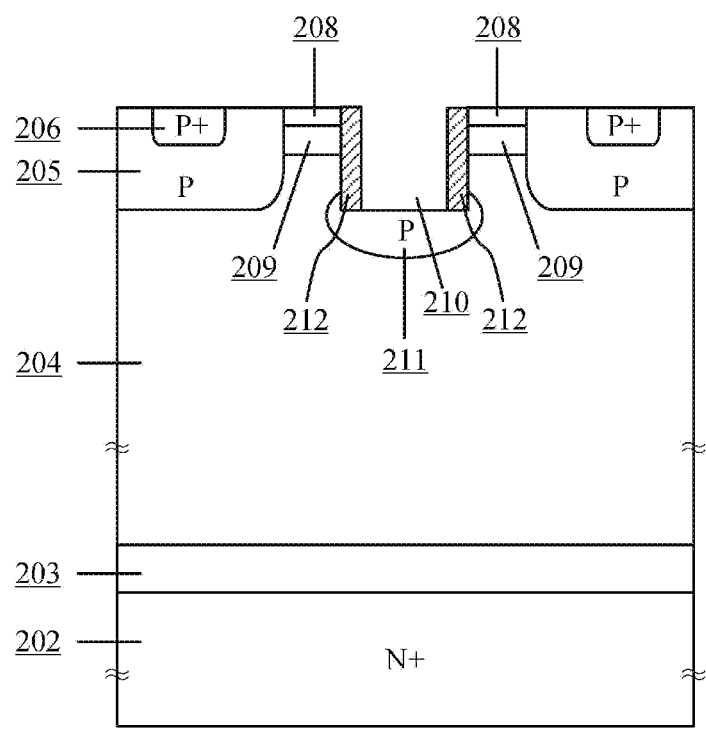

Fifthly, as shown in FIG. 12, the insulating dielectric layer is formed on the surfaces of the P-type planar anode region (205), the heavily doped P-type ohmic contact region (206), the heavily doped N-type emitter region (208) and the vertical trench (210). A sidewall region of the trench (210) is selectively retained by using a lithography and dry etching process so as to form an insulating dielectric layer (212). The width of the insulating dielectric layer (212) is smaller than that of the vertical trench region (210) and is about 0.1 μm and 2 μm. A commonly used insulating dielectric layer (212) material is a thermal oxide layer, low pressure chemical vapor deposited silicon dioxide, or silicon nitride. Then, annealing and drive-in process are performed on the semiconductor device at high temperature (greater than 850° C.) with nitrogen atmosphere to repair lattice damage and activate injected impurities of the heavily doped P-type ohmic contact region (206) and the heavily doped N-type emitter region (208).

Figure 13:
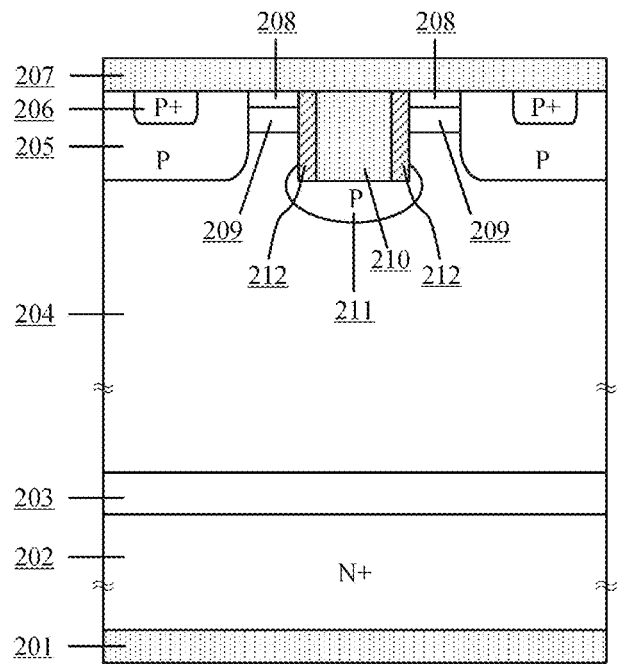

Finally, as shown in FIG. 13, the anode metal and the cathode metal are deposited on the front and back of the semiconductor device using a metal sputtering method, respectively. The front metal is selectively planarized by using a grinding process, and then sintering is performed at a high temperature (greater than 400° C.) with nitrogen atmosphere to achieve an alloy junction, thus forming an anode electrode (207) and a cathode electrode (201), respectively. It is also possible to thin the heavily doped N-type semiconductor substrate (202) to reduce the on-state resistance.

Embodiment 2

Figure 4:
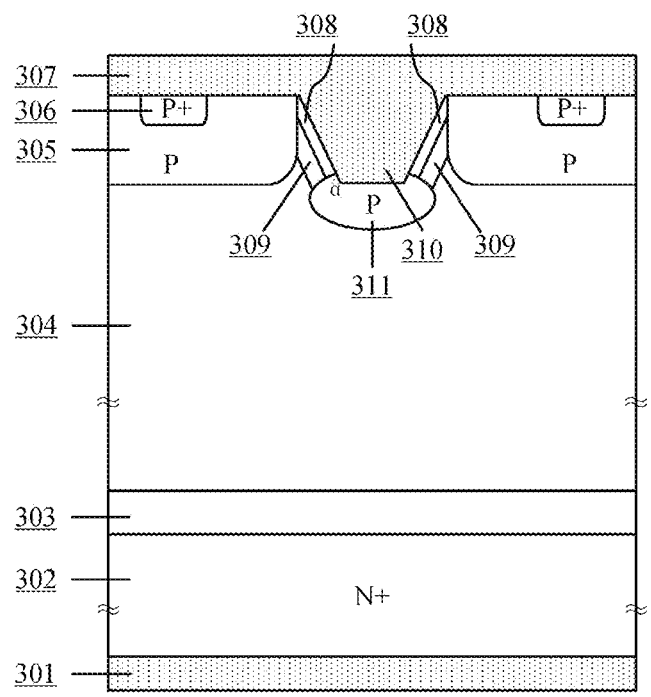
FIG. 4 is a schematic diagram of a cross section of an electron extraction type free-wheeling diode device structure with a slope trench in accordance with a second embodiment of the present disclosure.

FIG. 4 is an enlarged view of a cross section of a device in accordance with a second embodiment of the present disclosure. Compared with the device structure in the first embodiment shown in FIG. 2, the difference of the device structure in the second embodiment is that a slope trench structure is adopted. The topography of a slope trench region (310) is inverted trapezoidal, it is acceptable that an angle between the sidewall and a vertical direction is 60° to 90°. The sidewall is completely surrounded by the heavily doped N-type emitter region, and forms an ohmic contact with the anode electrode. When the position of the punch-through NPN triode is adjusted to a sidewall of the slope trench from the position adjacent to the trench gate, the anode conductive area may be effectively increased, which is conducive to reducing the on-state voltage drop and improving the forward surge current capacity of the device. With the increase of the density of trench gates, the punch-through NPN triode has increased area for anode electron extraction, which is more effective to lower the frontside carrier distribution within the drift region. Therefore, the soft and fast characteristics of reverse recovery process are further improved. The device of the second embodiment of the present disclosure shown in FIG. 4 is specifically described as follows:

The device includes: a cathode electrode (301) is located at the bottom, a heavily doped N-type semiconductor substrate (302) and a N-type buffer layer (303) which are in turn located above the cathode electrode (301). And a N-type drift region (304) is located on the N-type buffer layer (303). An upper surface of the N-type drift region (304) is provided with a P-type planar anode region (305), a lightly doped P-type base region (309) and a P-type trench anode region (311). An upper surface of the P-type planar anode region (305) is provided with a partially heavily doped P-type ohmic contact region (306). An upper surface of the lightly doped P-type base region (309) is provided with a heavily doped N-type emitter region (308), and the heavily doped N-type emitter region (308) is located on a sidewall of the slope trench region (310). The P-type planar anode region (305) is adjacent to the heavily doped N-type emitter region (308) and the lightly doped P-type base region (309). The P-type planar anode region (305) and the heavily doped P-type ohmic contact region (306) are connected to the heavily doped N-type emitter region (308) by means of an upper surface anode electrode (307). The anode electrode (307) is simultaneously connected to the sidewall of the slope trench region (310) and the upper surface of a P-type trench anode region (311). The heavily doped N-type emitter region (308) and the lightly doped P-type base region (309) are adjacent to the P-type trench anode region (311). The P-type trench anode region (311) is separated from the P-type planar anode region (305) by the N-type drift region (304). The heavily doped N-type emitter region (308), the lightly doped P-type base region (309) and the N-type drift region (304) form a punch-through NPN triode structure. The N-type drift region (304), the P-type planar anode region (305) and the P-type trench anode region (311) form a JFET structure. The topography of the slope trench region (310) is inverted trapezoidal, and its sidewall is completely surrounded by the heavily doped N-type emitter region (308).

Figure 5:
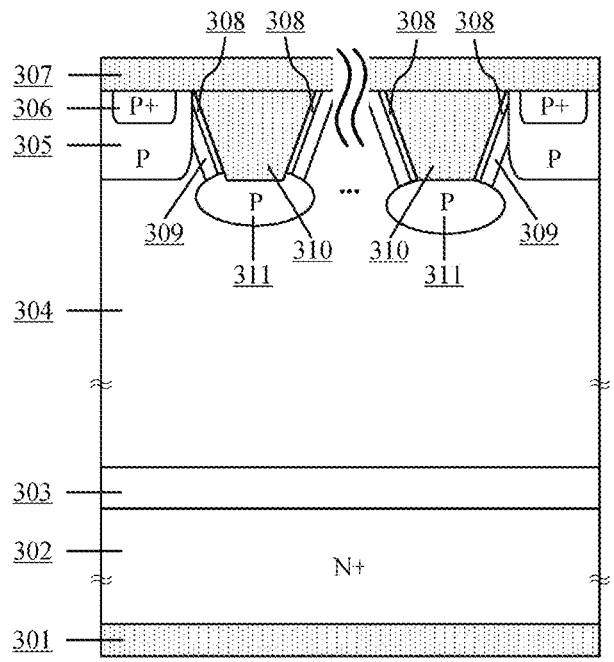
FIG. 5 is a schematic diagram of a cross section of an electron extraction type free-wheeling diode device structure with an enhanced slope trench in accordance with a second embodiment of the present disclosure.

Further, in the same cell, as shown in FIG. 5, the heavily doped N-type emitter region (308), the lightly doped P-type base region (309) may be arranged alternately with the slope trench region (310) and the P-type trench anode region (311), thus increasing the density of the electron extraction pathway of the punch-through NPN structure. The JFET structure is formed between the P-type planar anode region (305) and the P-type trench anode region (311).

The main operating principle and other key structural parameters of the device are consistent with those of the device in the first embodiment. As such, unnecessary details will not be repeated here.

In addition, the present disclosure further provides a preparation method for the device of the second embodiment, as shown in FIGS. 14-19.

Figure 14:
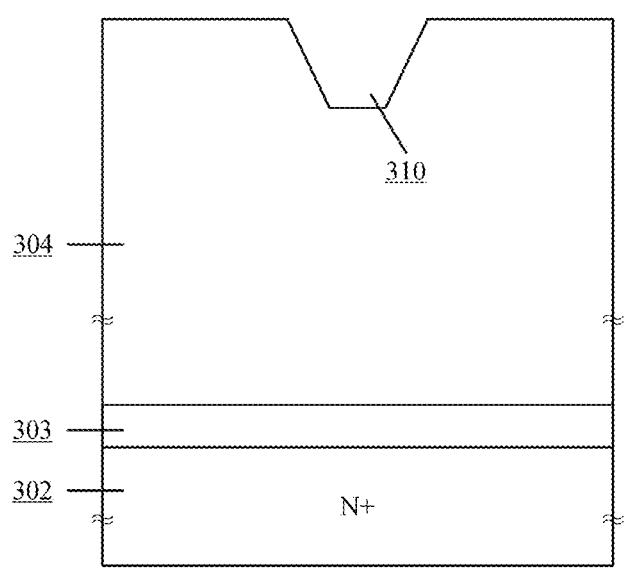
FIG. 14 to FIG. 19 are cross-sectional schematic diagrams of main preparation steps in accordance with a second embodiment of the present disclosure.

Firstly, as shown in FIG. 14, a N-type buffer layer (303) and a N-type drift region (304) are formed on a heavily doped N-type semiconductor substrate (302) by using an epitaxy process, respectively. And then a slope trench region (310) is formed on the upper surface of the N-type drift region (304) by means of dry etching, where the trench has a depth of 2 μm to 5 μm. The topography of the slope trench region (310) is inverted trapezoidal. An angle of the inverted trapezoidal slope is adjusted by controlling etching energy, etching time and passivation time by means of Bosch process.

Figure 15:
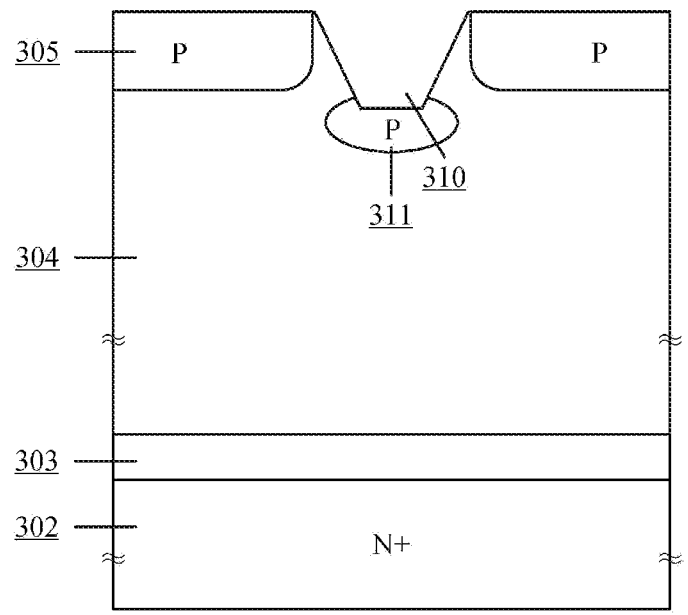

Secondly, as shown in FIG. 15, a mask layer is formed on the upper surface of the N-type drift region (304) to protect a sidewall of the slope trench region (310). An ion implantation window is formed by means of dry etching, and then a P-type planar anode region (305) and a P-type trench anode region (311) are formed by means of ion implantation and high temperature drive-in. A commonly used impurity for P-type implantation is boron.

Figure 16:
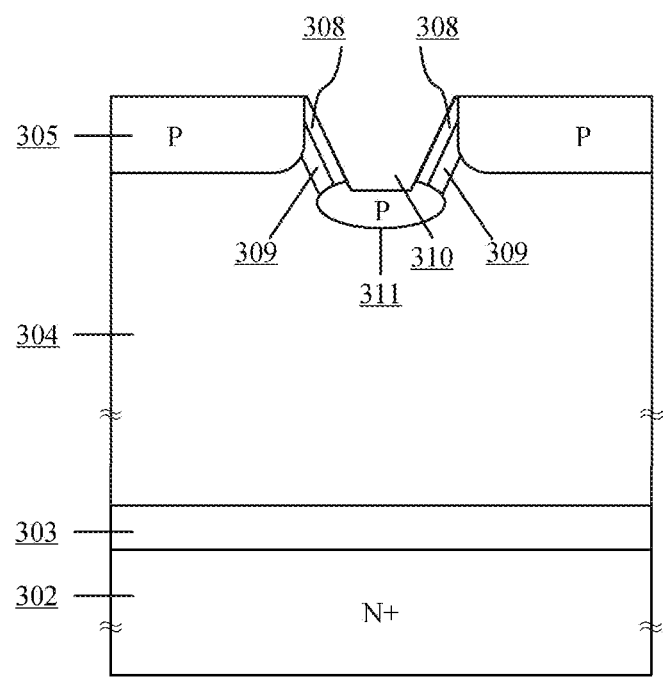

Thirdly, as shown in FIG. 16, at the position of the sidewall of the slope trench region (310), an ion implantation window of the punch-through NPN triode is formed by dry-etching the mask layer. At first, the P-type ion implantation and high temperature drive-in are performed to form a lightly doped P-type base region (309). A commonly used impurity for P-type implantation is boron. And then N-type ion implantation is performed to form a heavily doped N-type emitter region (308). A commonly used impurity for P-type implantation is arsenic.

Figure 17:
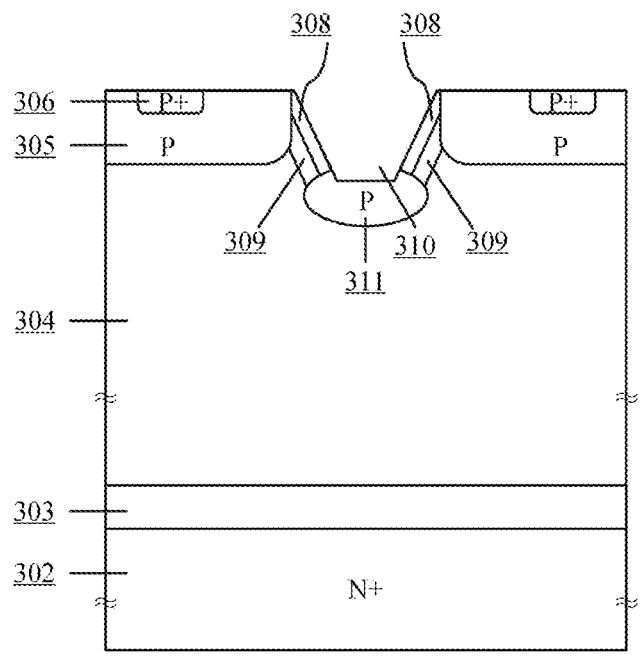

Fourthly, as shown in FIG. 17, an ion implantation window of a heavily doped P-type ohmic contact region (306) is formed on the upper surface of the P-type planar anode region (305) by dry-etching the mask layer, and then P-type ion implantation is performed. A commonly used impurity for P-type implantation is boron.

Figure 18:
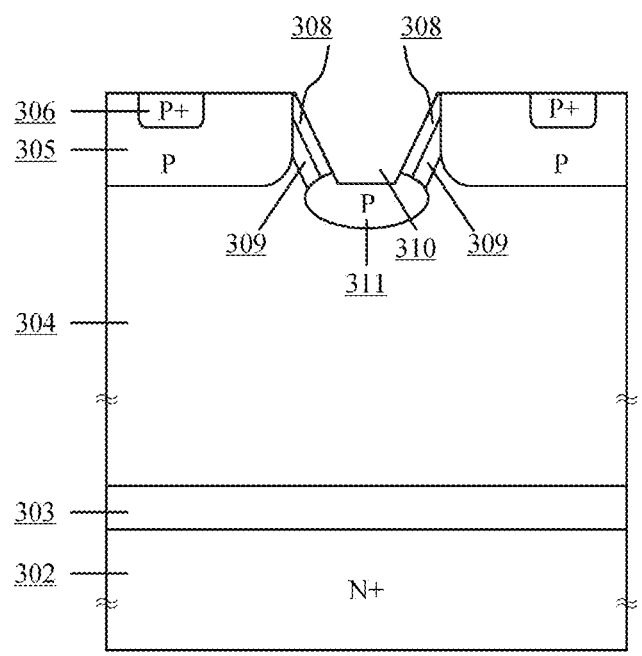

Fifthly, as shown in FIG. 18, the insulating dielectric layer is formed on the surfaces of the P-type planar anode region (305), the heavily doped P-type ohmic contact region (306), the heavily doped N-type emitter region (308) and the slope trench region (310). Then an anode insulating dielectric layer is completely removed by using a lithography and dry etching process to form a contact region. A commonly used insulating dielectric layer material can be a thermal oxide layer, low pressure chemical vapor deposited silicon dioxide, or silicon nitride. Sixthly, annealing and drive-in are performed on the semiconductor device at high temperature (greater than 850° C.) with nitrogen atmosphere to repair lattice damage and activate injected impurities of the heavily doped P-type ohmic contact region (306) and the heavily doped N-type emitter region (308).

Figure 19:
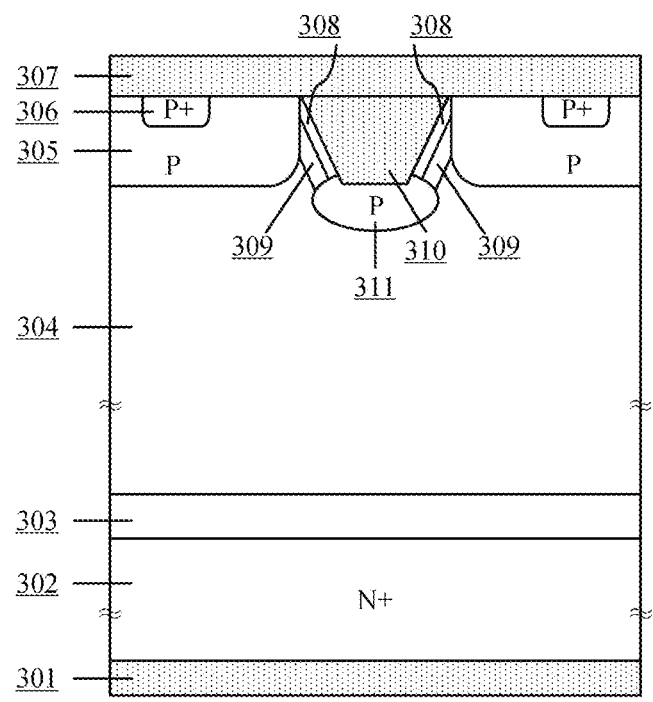

Finally, as shown in FIG. 19, the anode metal and the cathode metal are deposited on the front and back of the semiconductor device by using a metal sputtering method, respectively. The front metal is selectively planarized by using a grinding process, and then sintering is performed at a high temperature (greater than 400° C.) with nitrogen atmosphere to achieve an alloy junction, thus forming an anode electrode (307) and a cathode electrode (301), respectively.

Embodiment 3

Figure 6:
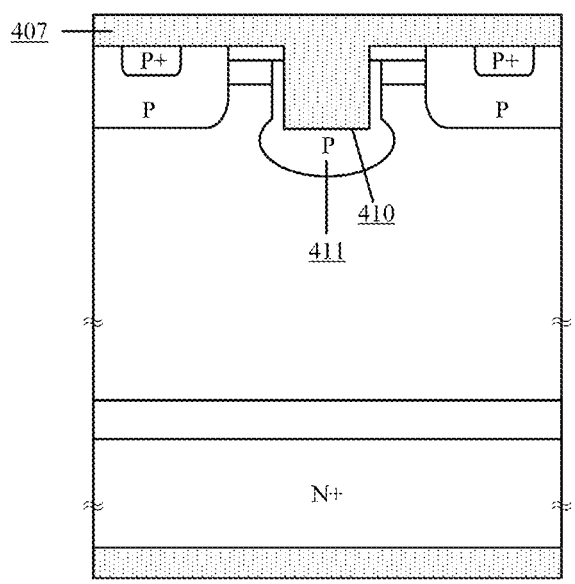
FIG. 6 is a schematic diagram of a cross section of an electron extraction type free-wheeling diode device structure in accordance with a third embodiment of the present disclosure.

FIG. 6 is an enlarged view of a cross section of a device in accordance with a third embodiment of the present disclosure. Compared with the device structure in the first embodiment shown in FIG. 2, the difference of the device structure in the third embodiment is the increase of the area of the anode P-type region. An anode electrode (407) is simultaneously connected to a sidewall of a vertical trench region (410) and a P-type trench anode region (411). The sidewalls and the bottom of the vertical trench region (410) are surrounded by the P-type trench anode region (411), and the anode electrode (407) forms a Schottky contact with the P-type trench anode region (411). This structure allows the conductive area of the P-type region to increase, which is beneficial to control hole injection efficiency. This structure also narrows the JFET conduction channel, which enhances the shielding effect against high electric fields and helps to reduce leakage current at high temperatures.

Figure 7:
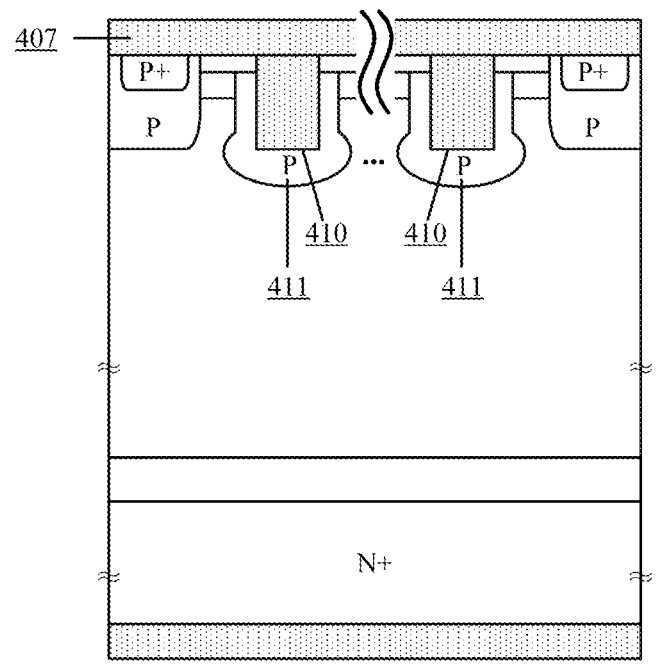
FIG. 7 is a schematic diagram of a cross section of an enhanced electron extraction type free-wheeling diode device structure in accordance with a third embodiment of the present disclosure.

Further, in the same cell, as shown in FIG. 7, the heavily doped N-type emitter region (308), the lightly doped P-type base region (309) may be arranged alternately with the slope trench region (310) and the P-type trench anode region (311). Thus it increases the density of the electron extraction pathway using the punch-through NPN structure. The JFET structure is formed between the P-type planar anode region (305) and the P-type trench anode region (311).

The main preparation process of the device is consistent with that of the device in the second embodiment. The topography of the P-type trench anode region (411) is decided by an ion implantation angle and the drive-in time, which may be a U-shaped topography.

The operating principle of the semiconductor device is explained as follows:

When the semiconductor device is forwardly conducted at low currents, the punch-through NPN triode of the proposed structure has a punch-through voltage drop value of 0.7 V. The holes of the anode region are mainly provided by the P-type planar anode region and the P-type trench anode region. And the hole injection current of the heavily doped P-type ohmic contact region is not dominant in the total anode current. The P-type planar anode region and the P-type trench anode region form the Schottky contact with the anode metal due to the fact that their doping concentrations are lower than that of the heavily doped P-type ohmic contact region. The anode metal is a cathode of the formed Schottky junction, the P-type planar anode region and the P-type trench anode region are the anode of the Schottky junction. The polarity characteristic of such Schottky junction results in a forward voltage drop of the diode. The forward voltage drop is partially distributed on the Schottky junction, leading to the potential drop across the P-type anode region and thus a decrease of the hole injection efficiency. The formed Schottky junction has no effect on the diffusion of electrons from the P-type anode region to the anode metal. Then the carrier distribution in the drift region shows a low frontside carriers and high backside carriers when the semiconductor device is conducted at low currents. The operating principle of the Schottky junction is the same as an existing SPEED structure mechanism.

Compared with the existing SPEED structure, the proposed structure also introduces a punch-through NPN triode structure for electron extraction from the drift region, which can further reduce the frontside hole injection efficiency and convert the anode hole currents into electron drift currents without significantly increasing the forward conduction voltage drop. For the SPEED structure, electrons transported from the backside cathode to the frontside anode metal includes: the electrons diffuse from the drift region to the P-type anode region, and then extracted by the anode metal. The electron diffusion is dominant in the whole process and is controlled by the P-type doping concentration. The electron diffusion cannot be accelerated by changing electric fields. An existing MPS structure is to convert the high PN junction barrier into the lower Schottky barrier for the electrons from the drift region to the anode metal, and in turn to reduce the anode hole injection efficiency. During the punch through of the NPN triode of the proposed structure, the electric field of the lightly doped P-type base region is greater than 1e4 V/cm. Then the electron drift velocity is close to saturation velocity, and carrier velocity overshoot may also occur when the junction depth of the lightly doped P-type base region is shallow. Then, the electrons close to the frontside position of the drift region are transported to the anode metal region at a saturation velocity, thus converting more anode hole currents into electron drift currents and reducing the anode hole injection. Therefore, the frontside carrier concentration in the drift region is lower in comparison with that of the SPEED structure.

During the reverse recovery process, in accordance with the lower frontside carrier distribution in the drift region, the reverse recovery charge is reduced. Meanwhile, the rapid extension of the PN junction depletion region in the drift region is facilitated to sweep the carriers out for withstand bus voltage, and thus the 'fast' characteristic of reverse recovery is achieved. In accordance with the high backside carriers in the drift region, the current can have enough carriers at the trailing stage to support current free-wheeling and suppress the further extension of electric field at the nn+ junction. Thus, it avoids the sudden reduction of reverse recovery current and increases the softness factor of the reverse recovery to suppress EMI noise generation.

When the semiconductor device is forwardly conducted at large currents or is subjected to forward surge currents, the hole injection of the heavily doped P-type ohmic contact region of the proposed structure is dominant. And the punch-through NPN structure is equivalent to a high-resistance region, the voltage drop generated by which at the large currents is greater than the on-state voltage drop of the PN junction. Then, the punch-through NPN structure has a weakened electron extraction effect, and the frontside carrier concentration is not significantly reduced. Therefore, the forward surge current capability of the proposed structure is not degraded compared to that of the SPEED structure.

When the semiconductor device is reversely blocked, the JFET structure formed by the P-type planar anode region, the P-type trench anode region and the N-type drift region may pinch off the JFET channel region to shield the impact of the high electric fields on the punch-through NPN structure. Meanwhile, the depletion region is a PN junction during punch through, compared to the Schottky junction of the MPS, the PN junction is more insensitive to high electric fields and high temperatures. Therefore, the leakage current of the proposed structure does not increase significantly during blocking state.

When the position of the punch-through NPN triode is adjusted to the sidewall of the slope trench, the anode conductive area is effectively increased, which is conducive to reducing the on-state voltage drop and improving the forward surge current capacity of the device. As the P-type trench anode region surrounds three sidewalls of the trench gate and forms the Schottky contact with the anode electrode, the conductive area of the P-type region is increased, which is beneficial to control hole injection efficiency control. It also narrows the JFET conduction channel, which enhances the shielding effect against high electric fields and helps to reduce leakage current at high temperatures. With the increase of the density of the trench gate, the punch-through NPN triode has increased area for anode electron extraction, which is more conducive to reducing frontside carrier distribution within the drift region, thereby further improving soft and fast characteristics of reverse recovery process.

What is claimed is:

1. An electron extraction type free-wheeling diode device, comprising:
    a cathode electrode located at the bottom, a heavily doped N-type semiconductor substrate and a N-type buffer layer in turn located above the cathode electrode, a N-type drift region located on the N-type buffer layer, and a P-type planar anode region located on the N-type drift region;
    wherein more than one first structures for increasing the density of electron extraction pathways are further provided on the N-type drift region, each of the first structures comprises a lightly doped P-type base region, a heavily doped N-type emitter region, a P-type trench anode region, and a trench region, wherein the heavily doped N-type emitter region is arranged on the lightly doped P-type base region, the trench region is arranged on the P-type trench anode region, an upper surface of the P-type planar anode region is provided with a partially heavily doped P-type ohmic contact region and an anode electrode is arranged in the trench region;
    an upper surface of the device is provided with an anode electrode, and the anode electrode is isolated from the N-type drift region;
    the heavily doped N-type emitter region, the lightly doped P-type base region and the N-type drift region form a punch-through NPN triode structure, the N-type drift region, the P-type planar anode region and the P-type trench anode region form a JFET structure, the P-type planar anode region and the P-type trench anode region form a Schottky contact with the anode electrode, and the heavily doped P-type ohmic contact region forms an ohmic contact with the anode electrode.

2. The electron extraction type free-wheeling diode device according to claim 1, wherein the anode electrode is isolated from the N-type drift region by means of an insulating dielectric layer arranged on a sidewall of the trench.

3. The electron extraction type free-wheeling diode device according to claim 1, wherein a cross-sectional shape of the trench region is inverted trapezoid, and an angle α between the sidewall and a vertical direction is 60° to 90°.

4. The electron extraction type free-wheeling diode device according to claim 3, wherein cross-sectional shapes of the heavily doped N-type emitter region and the lightly doped P-type base region are slope shapes in fit with an outer sidewall of the trench region.

5. The electron extraction type free-wheeling diode device according to claim 1, wherein the P-type trench anode region is in contact with the sidewall and the bottom of the trench region, and the anode electrode forms a Schottky contact with the P-type trench anode region.

6. The electron extraction type free-wheeling diode device according to claim 1, wherein the heavily doped P-type ohmic contact region has a lateral width smaller than that of the P-type planar anode region, and an area ratio of the heavily doped P-type ohmic contact region to the whole anode is 10% to 90%.

7. The electron extraction type free-wheeling diode device according to claim 1, wherein the P-type trench anode region has a U-shaped topography.

8. A preparation method for the electron extraction type free-wheeling diode device according to claim 1, wherein the preparation method comprises the following steps:

firstly, forming a N-type buffer layer and a N-type drift region above a heavily doped N-type semiconductor substrate, and then forming a trench region above the N-type drift region;

secondly, forming a mask layer on the upper surface of the N-type drift region to protect a sidewall of the trench, and forming an ion implantation window by means of dry etching, and forming a P-type planar anode region and a P-type trench anode region by means of ion implantation and high temperature drive-in;

thirdly, forming an ion implantation window of a punch-through NPN triode region: performing P-type ion implantation and high temperature drive-in to form a lightly doped P-type base region, and then performing N-type ion implantation to form a heavily doped N-type emitter region;

fourthly, forming an ion implantation window of a heavily doped P-type ohmic contact region on the upper surface of the P-type planar anode region, and then performing P-type ion implantation;

fifthly, forming an insulating dielectric layer on the surfaces of the P-type planar anode region, the heavily doped P-type ohmic contact region, a heavily doped N-type emitter region and a vertical trench, wherein the width of the insulating dielectric layer is smaller than that of the vertical trench region; and then performing annealing and drive-in on the semiconductor device at a high-temperature with nitrogen atmosphere to repair lattice damage and activate implanted impurities of heavily doped P-type ohmic contact region and the heavily doped N-type emitter region;

finally, depositing anode metal and cathode metal on the frontside and backside of the semiconductor device, planarizing the front metal, and then performing sintering at a high-temperature with nitrogen atmosphere to achieve an alloy junction, thus forming an anode electrode and a cathode electrode, respectively.

9. The preparation method for the electron extraction type free-wheeling diode device according to claim 8, wherein in the process of forming the insulating dielectric layer, a sidewall region of the vertical trench is selectively retained to form the insulating dielectric layer.

10. The preparation method for the electron extraction type free-wheeling diode device according to claim 8, wherein in the last step, the heavily doped N-type semiconductor substrate is thinned at first so as to reduce on-state resistance.

11. The preparation method for the electron extraction type free-wheeling diode device according to claim 8, wherein adjustment of an inverted trapezoidal slope angle is achieved by controlling etching energy, etching time, and passivation time during etching of the trench region.

12. The preparation method for the electron extraction type free-wheeling diode device according to claim 8, wherein the P-type trench anode region of a U-shaped topography is formed by controlling an ion implantation angle and drive-in time.

* * * * *